(12) United States Patent
Xie

(10) Patent No.: US 8,319,516 B2  
(45) Date of Patent: Nov. 27, 2012

(54) CIRCUIT FOR TESTING INRUSH CURRENT

(75) Inventor: Ling-Yu Xie, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 371 days.

(21) Appl. No.: 12/753,286

(22) Filed: Apr. 2, 2010

(65) Prior Publication Data

US 2011/0140732 A1    Jun. 16, 2011

(30) Foreign Application Priority Data

Dec. 11, 2009    (CN) .......................... 2009 1 0311334

(51) Int. Cl.
*G01R 31/40* (2006.01)
(52) U.S. Cl. .................. 324/764.01; 324/322; 324/347; 324/382; 324/678; 324/771; 323/235; 323/229; 307/64; 307/66
(58) Field of Classification Search .............. 324/771, 324/121, 322, 347, 382, 408, 678, 764.01, 324/765.01; 323/235, 229; 307/64, 66
See application file for complete search history.

(56) References Cited

U.S. PATENT DOCUMENTS

| | | | | |
|---|---|---|---|---|
| 4,591,781 A * | 5/1986 | Larson | ................. | 323/323 |
| 4,816,741 A * | 3/1989 | Ekstrand | ................ | 323/297 |
| 5,426,579 A * | 6/1995 | Paul et al. | ................ | 363/126 |
| 5,673,030 A * | 9/1997 | Kosich | ................ | 340/635 |
| 6,297,979 B1* | 10/2001 | Tse | ................ | 363/86 |
| 7,274,112 B2* | 9/2007 | Hjort et al. | ................ | 307/64 |
| 8,089,790 B2* | 1/2012 | Jung et al. | ................ | 363/84 |
| 8,233,301 B1* | 7/2012 | Guo | ................ | 363/140 |
| 2003/0090271 A1* | 5/2003 | Hurwicz | ................ | 324/424 |
| 2004/0183503 A1* | 9/2004 | Duff, Jr. | ................ | 320/128 |
| 2005/0040466 A1* | 2/2005 | Arai et al. | ................ | 257/362 |
| 2007/0030710 A1* | 2/2007 | Huang | ................ | 363/50 |
| 2007/0273335 A1* | 11/2007 | Duff | ................ | 320/166 |
| 2008/0024079 A1* | 1/2008 | Matsubara et al. | ........... | 318/376 |
| 2008/0111526 A1* | 5/2008 | Shuey | ................ | 323/274 |

FOREIGN PATENT DOCUMENTS

TW        200708742 A *  3/2007

* cited by examiner

*Primary Examiner* — Huy Q Phan
*Assistant Examiner* — Thang Le
(74) *Attorney, Agent, or Firm* — Altis Law Group, Inc.

(57) ABSTRACT

A circuit is configured for testing an inrush current of a power supply. The circuit includes a capacitor module, a voltage meter, a semiconductor switch, and a current meter. The capacitor module is connected to an power source for storing electric charge. The voltage meter is connected to the capacitor module for measuring a voltage across the capacitor module. The semiconductor switch is capable of connecting the capacitor module to the power supply and being closed when the voltage across the capacitor module reaches a predetermined value. The current meter is capable of measuring the inrush current at the time the power supply is powered on.

10 Claims, 3 Drawing Sheets

CIRCUIT FOR TESTING INRUSH CURRENT

BACKGROUND

1. Technical Field

The present disclosure relates to a circuit, and more particularly to a circuit for the testing of inrush current.

2. Description of Related Art

Inrush current, or input surge current, refers to the maximum, instantaneous input current drawn by an electrical device when first turned on. For example, at the moment a computer is powered on, a power supply of the computer incurs high inrush currents until it is fully powered up. If the inrush current is too great, the power supply is easily damaged. Thus, the power supply needs to be tested before being used within the computer.

The tester often uses a public alternating current (AC) source as the test electrical source. However, the public AC current may be unstable and variable, and the measurement of the magnitude of the tested inrush current not reliable. In this situation, the tester may not be sure whether the power supply meets performance standards. The tester must repeatedly test the power supply to be sure it can withstand the inrush current without damage. This is a time-consuming and imprecise procedure.

Furthermore, the tester often uses a switch with a movable contact connected between the AC source and the power supply. The movable contact easily rusted, and the inrush current may be disturbed, which can throw of the test results.

What is needed, therefore, is a circuit for testing the inrush current more precisely and without costly repetition.

DETAILED DESCRIPTION

The disclosure is illustrated by way of example and not by way of limitation. In the figures of the accompanying drawings in which like references indicate similar elements. It should be noted that references to "an" or "one" embodiment in this disclosure are not necessarily to the same embodiment, and such references mean at least one.

Figure 1:
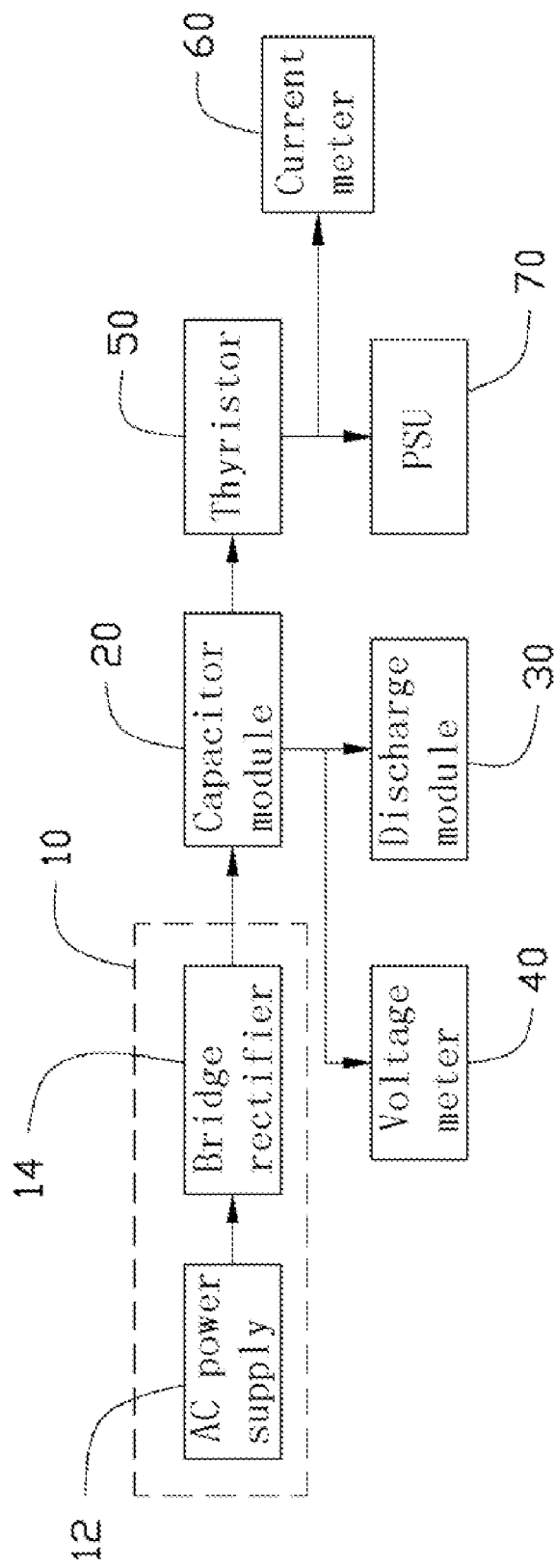
FIG. 1 is a block diagram of a circuit for testing inrush current of a power supply in accordance with an embodiment.

Referring to FIG. 1, in an embodiment, a circuit is configured for testing inrush current of a power supply unit (PSU) 70. The circuit includes a power source 10, a capacitor module 20, a discharge circuit 30, a voltage meter 40, a thyristor 50, and a current meter 60. The capacitor module 20 is connected to the power source 10 for storing electrical charge. The voltage meter 40 is configured for testing a voltage across the capacitor module 20. The thyristor 50 is connected between the capacitor module 20 and the PSU 70 for switchably powering on or off the PSU 70. The current meter 60 is connected to the PSU 70 for measuring an inrush current of the PSU 70.

Figure 2:
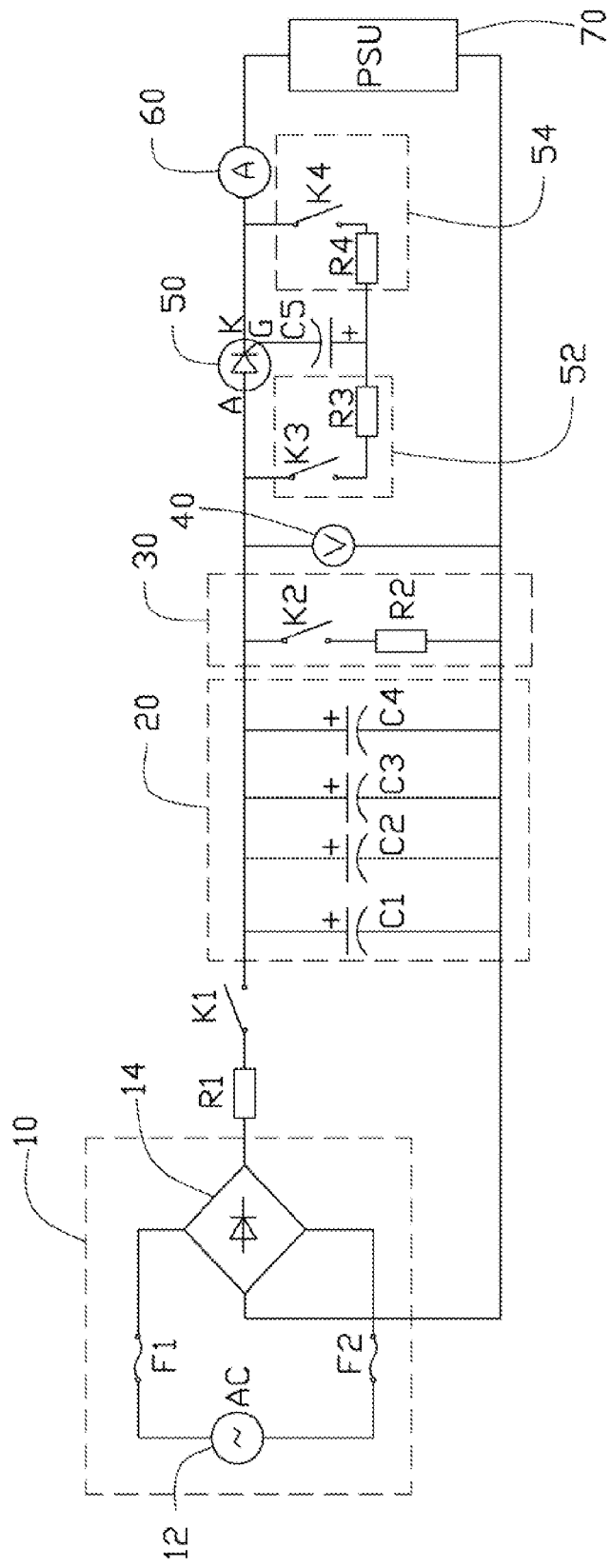
FIG. 2 is a detailed circuit diagram of FIG. 1.

Referring to FIG. 2, the power source 10 includes an alternating current (AC) power supply 12 and a bridge rectifier 14 connected to the AC power supply 12 via two fuses F1 and F2. As is known to those skilled in the art, the bridge rectifier 14 makes use of four diodes in a bridge arrangement to rectify an output of the AC power supply 12. The capacitor module 20 includes four capacitors C1-C4 connected in parallel. A positive terminal of the capacitor module 20 is connected to a positive output terminal of the power source 10 via a first switch K1 and a first resistor R1. A negative terminal of the capacitor module 20 is connected to a negative output terminal of the power source 10. The discharge circuit 30 includes a second switch K2 and a second resistor R2 connected in series. The capacitor module 20, the discharge circuit 30, and the voltage meter 40 are connected in parallel, and the voltage meter 40 is capable of measuring the voltage across the capacitor module 20.

The thyristor 50 has an anode terminal (labeled A), a cathode terminal (labeled K), and a gate terminal (labeled G). The anode terminal A of the thyristor 50 is connected to the positive terminal of the capacitor module 20. The cathode terminal K is connected to the PSU 70 via the current meter 60. The anode terminal A of the thyristor 50 further connects to a first switch circuit 52. One terminal of the first switch circuit 52 is connected to the anode terminal A of the thyristor 50, another terminal of the first switch circuit 52 is connected to the gate terminal G of the thyristor 50 via a capacitor C5. The first switch circuit 52 includes a third switch K3 and a third resistor R3 connected in series. The cathode terminal K of the thyristor 50 further connects to a second switch circuit 54. One terminal of the second switch circuit 54 is connected to the cathode terminal K of the thyristor 50, another terminal of the second switch circuit 54 is connected to the gate terminal G of the thyristor 50 via the capacitor C5. The second switch circuit 54 includes a fourth switch K4 and a fourth resistor R4 connected in series.

Figure 3:
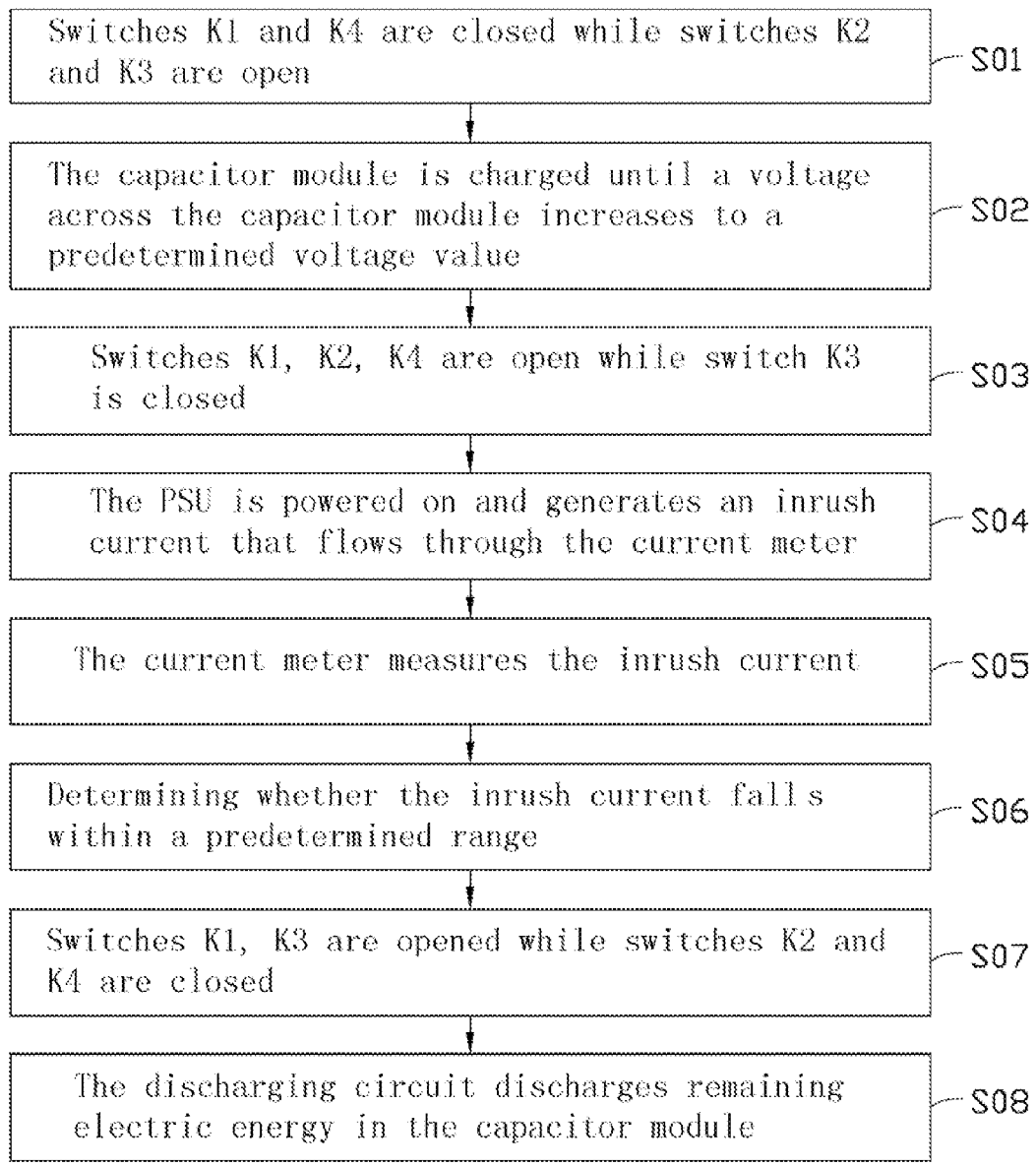
FIG. 3 illustrates an operation sequence of the circuit of FIG. 2.

Referring to FIG. 3, an operation sequence of the circuit described above includes following blocks.

In block S01, switches K1 and K4 are closed while switches K2 and K3 are open. Thus, the capacitor module 20 electrically connects to the power source 10 and is capable of storing electric charge. The thyristor 50 is rendered non-conductive (off state), and the PSU 70 is electrically disconnected from the power source 10 and powered off.

In block S02, the power source 10 charges the capacitor module 20, and a voltage across the capacitor module 20 increases until reaching a predetermined voltage value.

In block S03, switches K1, K2, K4 are open while switch K3 is closed. The power source 10 is electrically disconnected from the capacitor module 20 and stops charging the capacitor module 20 at the time the voltage across the capacitor module 20 reaches the predetermined voltage value. The thyristor 50 is rendered conductive (on state). The capacitor module 20 is electrically connected to the PSU 70 and capable of supplying electric power to the PSU 70.

In block S04, the PSU 70 is powered on and generates an inrush current that flows through the current meter 60.

In block S05, the current meter 60 measures the inrush current of the PSU 70.

In block S06, it is determined whether the inrush current falls within a predetermined range.

In block S07, after the inrush current is measured, switches K1, K3 are opened while switches K2 and K4 are closed. The thyristor 50 is rendered non-conductive (off state), and the capacitor module 20 stops providing power to the PSU 70.

The discharging circuit 30 discharges remaining charge in the capacitor module 20.

In one embodiment, the capacitor module 20 functions as an instantaneous power supply that provides a voltage of predetermined value to power on the PSU 70. Thus, the circuit is capable of testing the inrush current more precisely and without costly repetition. The thyristor 50 connected between the capacitor module 20 and the PSU 70 is a semiconductor switch without movable contacts, and so will not rust and disturb the inrush current.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A circuit for testing an inrush current of a power supply, the circuit comprising:
    a capacitor module capable of storing electric charge supplied by a power source;
    a voltage meter connected to the capacitor module and capable of measuring a voltage across the capacitor module;
    a semiconductor switch capable of connecting the capacitor module to the power supply, the semiconductor switch being closed when the voltage across the capacitor module reaches a predetermined value;
    a current meter capable of measuring the inrush current at the time the power supply is powered on;
    a discharging circuit connected to the capacitor module in parallel and comprising a second resistor and a second switch connected in series; and the discharging circuit is capable of discharging remaining electric energy of the capacitor module after the inrush current is measured when the second switch is closed;
    the semiconductor switch is a thyristor; and
    an anode terminal of the thyristor is connected to a positive terminal of the capacitor module, a cathode terminal of the thyristor is connected to the current meter, and a gate terminal of the thyristor is connected to a capacitor.

2. The circuit as described in claim 1, further comprising a first switch circuit connected between the anode terminal of the thyristor and the capacitor.

3. The circuit as described in claim 2, further comprising a second switch circuit connected between the cathode terminal of the thyristor and the capacitor.

4. The circuit as described in claim 3, wherein the first switch circuit comprises a third resistor and a third switch in series.

5. The circuit as described in claim 3, wherein the second switch circuit comprises a fourth switch resistor and a fourth switch in series.

6. A circuit for testing an inrush current of a power supply, the circuit comprising:
    a capacitor module capable of storing electric charge;
    a first switch capable of connecting the capacitor module to a power source, the first switch being closed until a voltage across the capacitor module increases to a predetermined value;
    a semiconductor switch capable of connecting the capacitor module to the power supply, the semiconductor switch being closed when the voltage across the capacitor module increases to the predetermined value;
    a current meter capable of measuring the inrush current at the time the power supply is powered on;
    a discharging circuit connected in parallel with the capacitor module and comprising a resistor and a second switch connected in series; and the discharging circuit capable of discharging remaining electrical energy of the capacitor module after the inrush current is measured when the second switch is closed;
    the semiconductor switch is a thyristor; and
    an anode terminal of the thyristor is connected to a positive terminal of the capacitor module, a cathode terminal of the thyristor is connected to the current meter, and a gate terminal of the thyristor is connected to a capacitor.

7. The circuit as described in claim 6, further comprising a first switch circuit connected between the anode terminal of the thyristor and the capacitor.

8. The circuit as described in claim 7, further comprising a second switch circuit connected between the cathode terminal of the thyristor and the capacitor.

9. The circuit as described in claim 8, wherein the first switch circuit comprises a third resistor and a third switch in series.

10. The circuit as described in claim 8, wherein the second switch circuit comprises a fourth switch resistor and a fourth switch in series.

* * * * *